United States Patent
Kim

(10) Patent No.: US 9,034,416 B2
(45) Date of Patent: May 19, 2015

(54) METHOD OF FABRICATING ORGANIC ELECTROLUMINESCENT DISPLAY DEVICE

(75) Inventor: Ock-Hee Kim, Gyeonggi-Do (KR)

(73) Assignee: LG DISPLAY CO., LTD., Seoul (KR)

( * ) Notice: Subject to any disclaimer, the term of this patent is extended or adjusted under 35 U.S.C. 154(b) by 1963 days.

(21) Appl. No.: 11/645,699

(22) Filed: Dec. 27, 2006

(65) Prior Publication Data
US 2007/0155274 A1    Jul. 5, 2007

(30) Foreign Application Priority Data
Dec. 30, 2005 (KR) .................. 10-2005-0136154

(51) Int. Cl.
*B05D 7/00* (2006.01)
*H01L 51/56* (2006.01)
*H01L 51/00* (2006.01)
*H01L 27/32* (2006.01)

(52) U.S. Cl.
CPC ............. *H01L 51/56* (2013.01); *H01L 27/3211* (2013.01); *H01L 51/0013* (2013.01); *H01L 51/0024* (2013.01)

(58) Field of Classification Search
USPC .......................................................... 427/64
See application file for complete search history.

(56) References Cited

U.S. PATENT DOCUMENTS

| | | | |
|---|---|---|---|
| 5,206,749 A * | 4/1993 | Zavracky et al. | 349/45 |
| 6,140,009 A * | 10/2000 | Wolk et al. | 430/200 |
| 6,469,318 B2 * | 10/2002 | Yamada et al. | 257/59 |
| 6,703,179 B2 | 3/2004 | Tyan | 430/200 |
| 6,822,702 B2 * | 11/2004 | Chapman et al. | 349/43 |
| 6,929,048 B2 * | 8/2005 | Phillips | 156/540 |
| 7,358,538 B2 * | 4/2008 | Lu et al. | 257/97 |
| 2003/0113656 A1 * | 6/2003 | Tyan et al. | 430/200 |
| 2003/0180495 A1 * | 9/2003 | Ito et al. | 428/64.4 |
| 2005/0276919 A1 * | 12/2005 | Truskett et al. | 427/230 |

FOREIGN PATENT DOCUMENTS

| | | |
|---|---|---|
| CN | 1454034 | 11/2003 |
| KR | 2003-0051379 | 6/2003 |

* cited by examiner

*Primary Examiner* — Robert Vetere
(74) *Attorney, Agent, or Firm* — McKenna Long & Aldrdige LLP

(57) ABSTRACT

A method for fabricating an organic electroluminescent display device usable for large-area applications includes: preparing a first substrate; preparing a transfer plate having at least one transfer pattern; forming a first electrode on the first substrate; forming organic light emitting patterns on the at least one transfer pattern on the transfer plate within a region; and bonding the first substrate to the transfer plate, and after the bonding, transferring the organic light emitting patterns from the transfer plate onto the first substrate using a pressure difference between an area within the region and an area outside of the region.

31 Claims, 9 Drawing Sheets

METHOD OF FABRICATING ORGANIC ELECTROLUMINESCENT DISPLAY DEVICE

This application claims the benefit of Korea Patent Application No. 10-2005-0136154, filed on Dec. 30, 2005, which is hereby incorporated by reference for all purposes as if fully set forth herein.

BACKGROUND OF THE INVENTION

1. Field of the Invention

The present invention relates to an organic electroluminescent display device, and more particularly, to a method of fabricating an organic electroluminescent display device.

2. Discussion of the Related Art

The demand for thinner flat panel display devices has increased with the demand for large-sized display devices. One type of thin flat panel display, the electroluminescent display device (ELD) has received increased attention.

ELD devices may be classified either as inorganic electroluminescent display devices and organic electroluminescent display devices depending upon the type of material used in their construction. Organic ELD device have the advantage they can be driven with a lower voltage (e.g., less than 10V) than plasma display panels or inorganic ELD devices. In an organic ELD device, pairs of electrons are created by injecting electrical charges are injected into an organic emitting layer provided between a hole injection electrode (cathode) and an electron injection electrode (anode). Recombination of the created electrons and holes results in the emission of light. Because of their advantages, organic ELD devices are being actively researched and developed.

FIG. 1 schematically illustrates the structure of a typical organic electroluminescent display device. As illustrated in FIG. 1, a typical organic electroluminescent display device 10 has a cathode electrode 3 and an anode electrode 1 facing into each other on a transparent substrate, such as a glass substrate. By applying a voltage between the cathode electrode 3 and the anode electrode 1, light is emitted from an organic emitting layer 5 formed between the anode electrode 1 and the cathode electrode 3. The anode electrode 1 may be formed of a transparent conductive material such as indium-tin-oxide (ITO) that readily supplies holes and facilitates the emission of light from the device. The cathode electrode 3 may be formed of a metal having a low work function to allow electrons to be easily supplied.

Accordingly, if a positive (+) voltage and a negative (−) voltage are respectively applied to the anode electrode 1 and the cathode electrode 3, the holes injected from the anode electrode 1 and the electrons injected from the cathode electrode 3 are re-combined in the organic emitting layer, thereby causing the emission of light. The color of the emitted light depends on the material forming the organic emitting layer 5. For example, R (red), G (green), and B (blue) emission colors may be variously emitted by organic emitting layers 5 including appropriately selected materials.

An organic luminescent device may include a plurality of unit pixels arranged in a matrix. By selectively driving the organic emitting layer of the unit pixels using a driving device and a switching device provided at each unit pixel, an image may be displayed. The driving device and the switching device may each include a thin film transistor.

In an organic luminescent device of the related art, three R, G, and B unit pixels constitute a basic unit for driving. The organic emitting layer of the organic electroluminescent display device can be formed by various methods of the related art including a shadow mask method, an inkjet method, a laser induced transfer imaging (LITI) method, and a micropatterning method.

The shadow mask method is a method of forming RGB emitting layers on a substrate for film formation by alignment by using a mask having open portions corresponding to the organic emitting layer regions. However, this method is not easily usable for the manufacture of large-area display devices because problems such as alignment errors make obtaining a high resolution using mask processing difficult.

The inkjet method is a method that is mainly used for polymers, in which a liquid phase polymer is dripped onto a desired position by an inkjet to form the respective RGB emitting layers.

The LITI method is a method in which respective RGB emitting layers are formed on a polymer film having a heat absorption layer, placed and aligned on a substrate, and then sequentially transferred by applying heat specifically to a desired pattern position using a laser. The LITI method requires an additional polymer film for transfer, and is difficult to perform.

The micropatterning method is a method in which an epoxy mold is placed on a substrate on which an emitting layer is formed, and pressed with a predetermined pressure to remove undesired portions from the emitting layer. The micropatterning method is unsuitable for manufacturing an organic electroluminescent display device because peripheral portions of the pattern are not kept clean. Moreover, the epoxy mold becomes larger as the area of a display device becomes larger, making it difficult to apply a uniform pressure throughout the entire substrate. Accordingly, the micropatterning method of the related art is not suitable for reliable manufacture of large-area display devices.

SUMMARY OF THE INVENTION

Accordingly, the present invention is directed to a method of fabricating organic electroluminescent display device that substantially obviates one or more of the problems due to limitations and disadvantages of the related art.

An advantage of the present invention is to provide a method of fabricating an organic electroluminescent display device that can be used for large-area applications.

Another advantage of the present invention is to provide a fabricating method of fabricating an organic electroluminescent display device that can enhance reliability.

Additional features and advantages of the present invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an organic electroluminescent display device according to the present invention includes: preparing a first substrate; preparing a transfer plate having at least one transfer pattern; forming a first electrode on the first substrate; forming organic light emitting patterns on the at least one transfer pattern on the transfer plate within a region; and bonding the first substrate to the transfer plate, and after the bonding, transferring the organic light emitting patterns from the transfer plate onto the first substrate using a pressure difference between an active area within the region and an area outside of the region.

In another aspect of the present invention, a method of forming an organic electroluminescent device includes: preparing a substrate having an electrode; preparing a transfer plate including at least one transfer pattern in a predetermined position; forming an organic layer on the at least one transfer pattern on the transfer plate; transferring the organic layer on the at least one transfer pattern on the transfer plate onto the electrode on the substrate; and providing a plurality of controlling elements for applying a signal to the electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

A method of fabricating an organic electroluminescent display device according to the present invention will now be described in detail with reference to the accompanying drawings.

Figure 1:
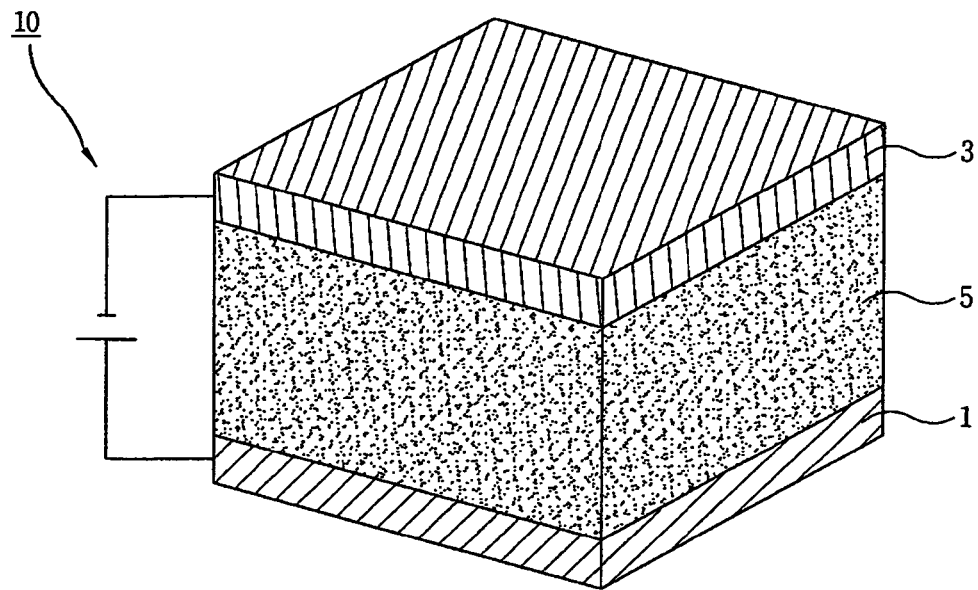
FIG. 1 is a block diagram schematically illustrating the structure of a typical organic electroluminescent device.
Figure 2:
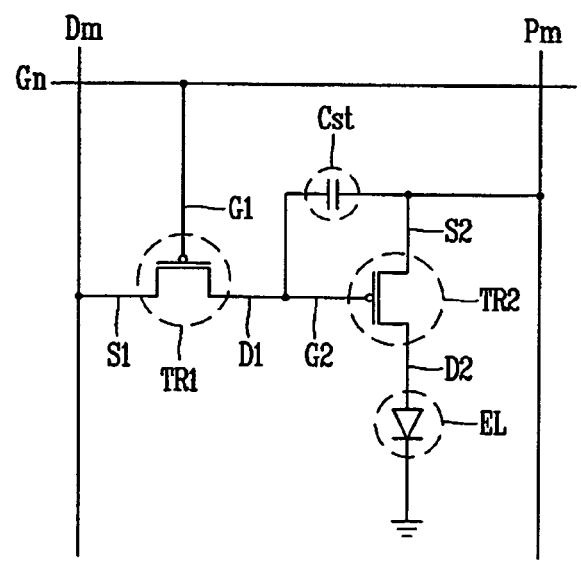
FIG. 2 is a schematic diagram showing an equivalent circuit diagram of an organic electroluminescent display device.

FIG. 2 is a schematic diagram showing an equivalent circuit diagram of an organic electroluminescent display device.

As shown therein, the organic electroluminescent display device 100 includes first and second thin film transistors TR1 and TR2, which are disposed in regions defined by n rows of gate lines Gn supplying gate signals, m columns of data lines Dm supplying data signals, and m number of power lines Pm supplying a power supply voltage. The gate lines Gn and the data lines Dm cross each other, and an organic electroluminescent device EL and the first and second thin film transistors TR1 and TR2 driving the organic electroluminescent device EL are provided near the crossing points thereof.

Additionally, a capacitor Cst is provided, in which an electrode at one side is commonly connected to the drain electrode D1 of the first thin film transistor TR1 and the gate electrode G2 of the second thin film transistor TR2, and an electrode at the other side is connected to the source electrode S2 of the second thin film transistor TR2 and the power line Pm.

The first thin film transistor TR1 includes a source electrode S1 connected to one of the data lines Dm and supplying a data signal; a gate electrode G1 connected to one of the gate lines Gn and supplying a scan signal; and a drain electrode D1 connected to a gate electrode G2 of the second thin film transistor TR2. The first thin film transistor TR1 serves as a switching device for the organic electroluminescent device EL.

The second thin film transistor TR2 includes a gate electrode G2 connected to the drain electrode D1 of the first thin film transistor TR1, a drain electrode D2 connected to an anode electrode of the organic electroluminescent device EL and a source electrode S2 connected to the power line Pm, and serves as a driving device for the organic electroluminescent device EL.

Figure 3:
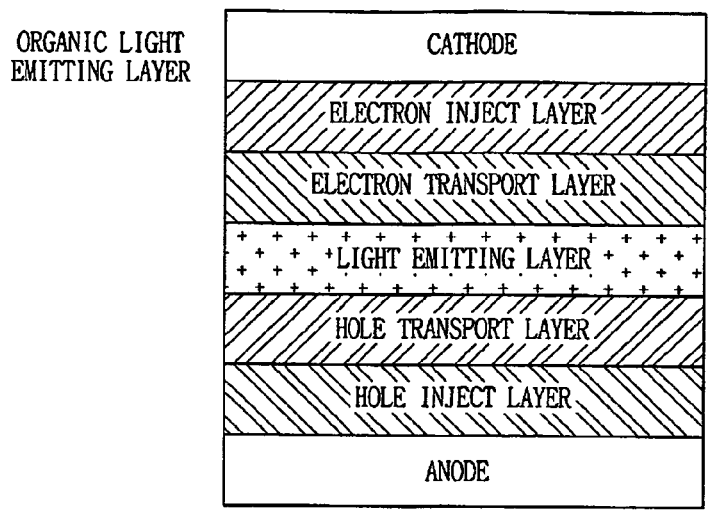
FIG. 3 is a cross sectional view showing the configuration of an organic electroluminescent device according to an embodiment of the present invention.

The organic electroluminescent device EL includes an anode electrode connected to the drain electrode D2 of the second thin film transistor TR2, a cathode electrode connected to the ground line and an organic light emitting layer formed between the cathode electrode and the anode electrode. As shown in FIG. 3, the organic light emitting layer includes a hole injection layer, a hole transport layer, a hole carrier layer, a light emitting layer, an electron transport layer, and an electron injection layer.

The organic light emitting layer can be formed by preparing a substrate for forming organic light emitting patterns and transferring them onto the anode electrode. A method of forming an organic light emitting layer according to embodiments of the present invention will be described in more detail with reference to the accompanying drawings.

Figure 4:
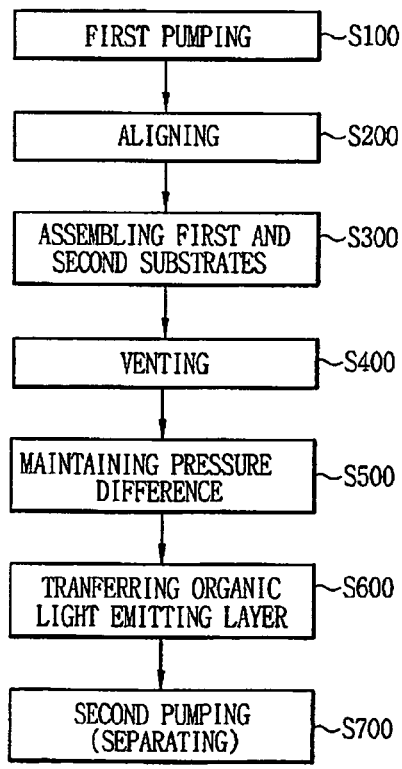
FIG. 4 is a flow chart describing a method of fabricating an organic electroluminescent device according to the present invention.

FIG. 4 is a process flow chart schematically showing a method of fabricating an organic light emitting layer according an embodiment of the present invention. FIGS. 5A to 5D shows process cross sectional views of FIG. 4.

Figure 5A:
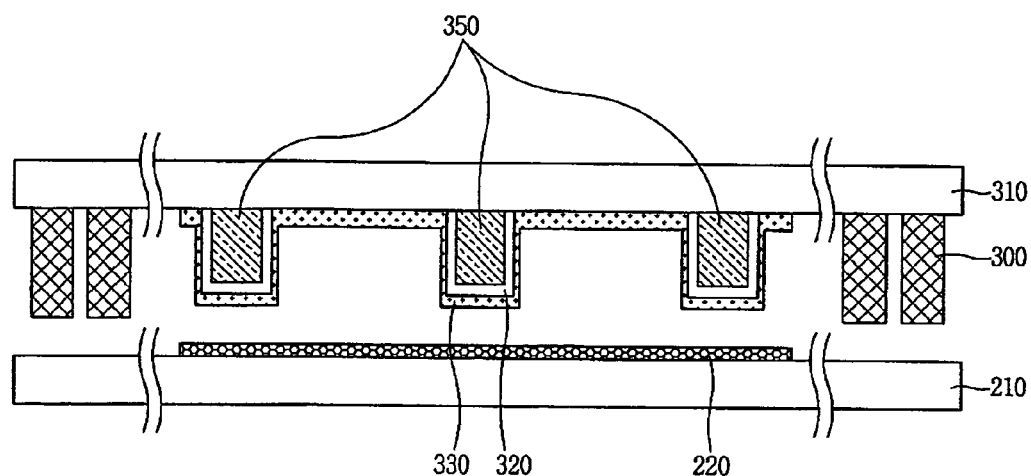
FIGS. 5A, 5B, 5C, and 5D are cross sectional views illustrating a process for fabricating an organic electroluminescent display device according to the present invention.

First, as shown in FIG. 4 and FIG. 5A, there are prepared a first substrate 210 an which an organic light emitting layer, that is, an anode electrode, is to be formed, and a transfer plate 310 including a second substrate for transferring organic light emitting patterns onto the first substrate. A vacuum is formed by a first pumping of a vacuum chamber (S100), and the first substrate 210 and the transfer plate 310 are aligned in the vacuum chamber (S200). As will be described in detail, a sealing material 300 is coated on the first substrate along the periphery of a region to enclose the region in which an active area is to be formed.

With the alignment achieved, the transfer plate is bonded to the first substrate using sealing material formed on the transfer plate (S300).

While the pressure inside the chamber is raised by venting the inside of the vacuum chamber (S400) and a pressure difference is maintained between regions inside and outside of the active area encompassed by the sealing material (S500). The pressure difference between the inside and outside of the active area causes a uniform pressure to be applied to the entire part of the first substrate resulting in transferring the organic light emitting patterns onto the first substrate (S600).

Subsequently, the pressure of the outside of the active area is lowered below the pressure of the inside of the active area by a second pumping of the vacuum chamber and the first substrate is separated from the transfer plate (S700).

In the illustrated embodiment of the present invention, the organic light emitting patterns formed on the second substrate of the transfer plate are transferred onto the first substrate through a force applied by a pressure difference between the inside and outside of the active area rather than by a mechanically applied force. Using the differential pressure method allows a uniform pressure to be applied throughout the entire part of the substrate, and accordingly, the manufacture of the method large-area devices is facilitated.

The method of fabricating an organic light emitting layer will be described in more detail with reference to FIGS. 5A to 5D.

First, as shown in FIG. 5A, a first substrate 210 having a first electrode 220 for forming an organic electroluminescent device and an array of patterns 350 for forming a plurality of organic light emitting patterns on an active area are formed; an organic light emitting film 330 is formed on top of the array of patterns 350; and a transfer plate 310 on which a sealing material 300 is formed is prepared along the periphery of the active area.

Figure 6:
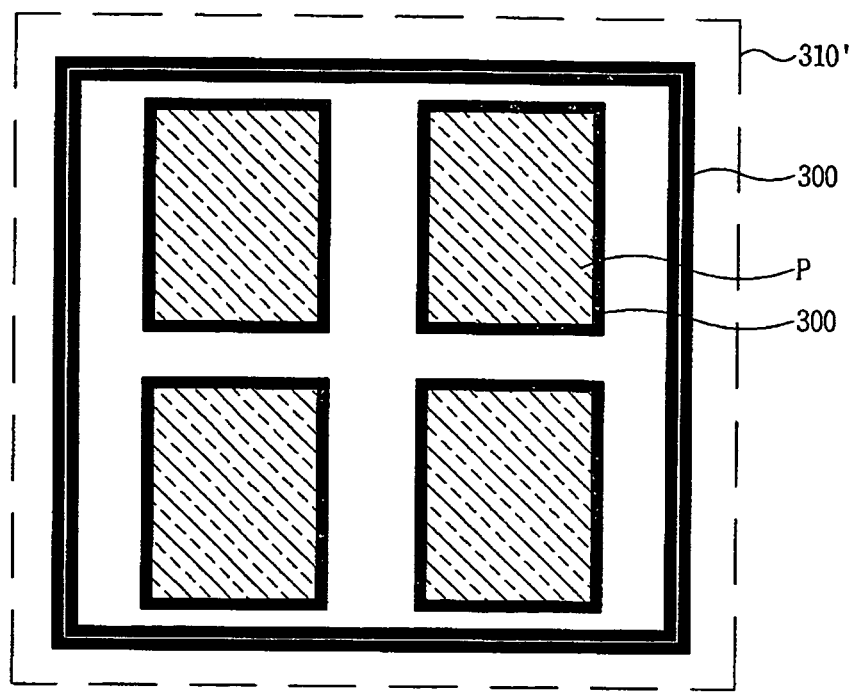
FIG. 6 is a plan view of a transfer plate showing a sealing material formed on a substrate for forming organic light emitting patterns according to the present invention.

The sealing material 300 is formed in a closed shape, and as shown in FIG. 6, sealing material may be formed along the periphery of a mother substrate 310 having a plurality of unit panels P and may also be formed along the periphery of each unit panel P.

The array of patterns 350 may be formed of a polymer structure having a height of several μm. A buffer film 320 for reducing or eliminating adhesion between the array of patterns 350 and the organic light emitting film 330 may be additionally formed between the array of patterns 350 and the organic light emitting film 330. An inorganic matter silicon oxide (SiOx) or silicon nitride (SiNx) may be used as the buffer film 320. The surface of the surface of the buffer film 320 may be processed with a plasma treatment or a hydrophobic treatment to facilitate the transfer of the organic light emitting film to the first substrate 210.

The organic light emitting film 330 includes an organic film for emitting light of red, green and blue color. The organic light emitting film 330 further includes electron and hole injection layers and electron and hole transport layers.

To facilitate the transfer the organic light emitting film 330 formed on the second substrate of the transfer plate 310 onto the first substrate 210, an adhesive layer may be additionally formed on the first substrate 210. Alternatively, a hole injection layer or a hole transport layer may be formed in advance on the first substrate. In this manner, an adhesive layer, a hole injection layer, or a hole transport layer is formed on the first substrate to improve the adhesion to the organic light emitting film 330 to be transferred onto the first substrate to improve and the interface properties between these organic layers to thus enhance efficiency of the transfer of the organic light emitting film.

FIGS. 7A to 7F each show organic light emitting films in accordance with embodiments of the present invention that can be formed on first and transfer plate before the organic light emitting film is transferred onto the first substrate. In the illustrations, a first electrode on the first substrate is shown to be an anode electrode. However, the first electrode on the first substrate may alternatively be a cathode electrode.

Figure 7A:
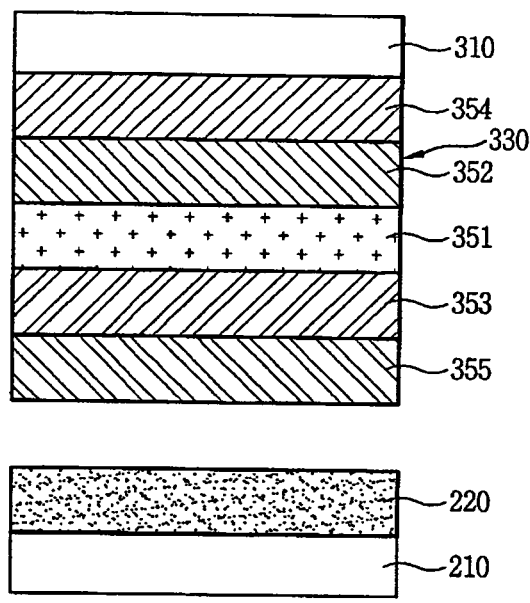
FIGS. 7A to 7F are cross sectional views illustrating a refractive mask process for forming a first electrode of an organic electroluminescent device of an organic light emitting layer, which can be formed on a first substrate and a transfer plate.

First, as shown in FIG. 7A, a first electrode 220 is formed on a first substrate 210, and an organic light emitting film 330 may be formed on a transfer plate 310, the organic light emitting film 330 having electron/hole transport layers 352 and 353 and electron/hole injection layers 354 and 355 formed over and under a luminescent layer 351 disposed therebewteen. The electron/hole transport layers 352 and 353 and the electron/hole injection layers 354 and 355 are formed for increasing the luminous efficiency of the luminescent layer 351. When the first electrode 220 is a cathode electrode, the positions of the electron/hole transport layers 352 and 353 and electron/hole injection layers 354 and 355 relative to the luminescent layer 351 are reversed.

A pretreatment, such as UV irradiation, ozone and plasma treatment, etc, may be performed onto the surface of the first electrode 220 to enhance adhesion to the organic light emitting film 330, or a thin metal layer may be additionally formed thereon.

Figure 7B:
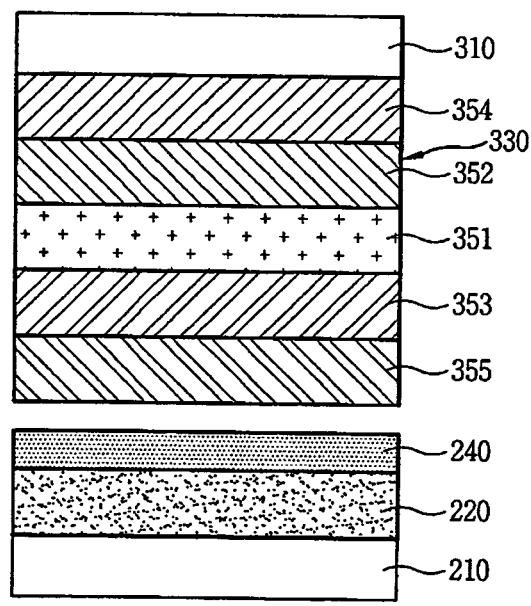

Alternatively, as shown in FIG. 7B, adhesion to the organic light emitting film 330 can be enhanced by additionally forming an adhesive layer 240 on the first electrode 220 of the first substrate 210.

Figure 7C:
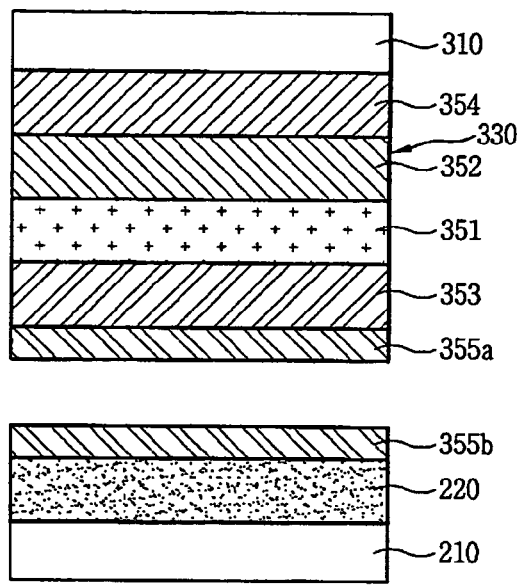

Alternatively, as shown in FIG. 7C, the interface properties and adhesion properties can be enhanced by forming a second hole transport layer 355$b$ on the first electrode 220 using the same material as a first hole transport layer 355$a$ of the transfer plate 310. When the first electrode 220 is a cathode, a second electron injection layer may be formed on the first electrode 220, so that it can be contacted with a first electron injection layer formed on the transfer plate 310.

Figure 7D:
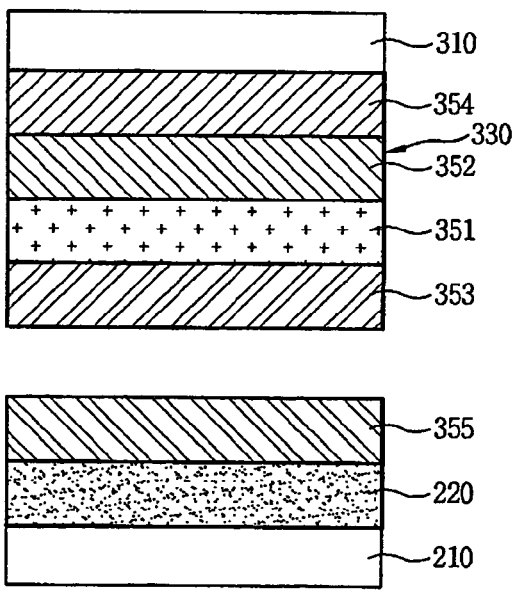

Alternatively, as shown in FIG. 7D, the hole injection layer 355 may be formed on the first electrode 220, and the electron injection layer 354, electron/hole transport layers 352 and 353 and luminescent layer 351 may be formed on the transfer plate 310.

Figure 7E:
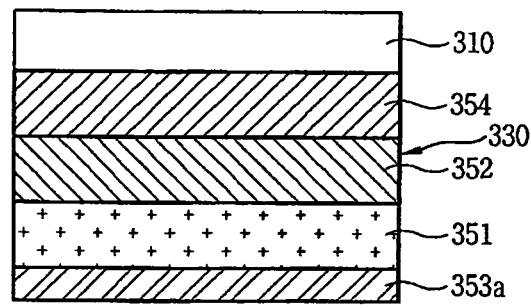
Figure 7E:
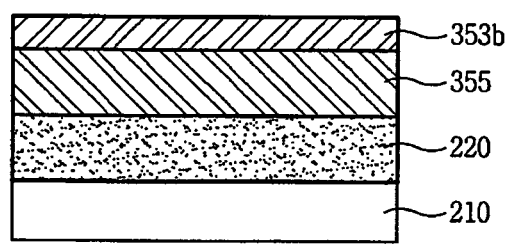

Alternatively, as shown in FIG. 7E, the hole injection layer 355 and the second hole transport layer 353$b$ may be formed on the first electrode 220, and the electron injection layer 354, electron/first hole transport layers 352 and 353$a$ and luminescent layer 351 may be formed on the transfer plate 310.

Figure 7F:
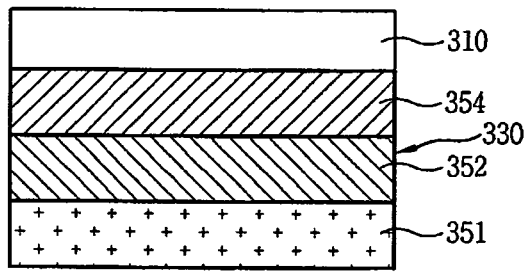
Figure 7F:
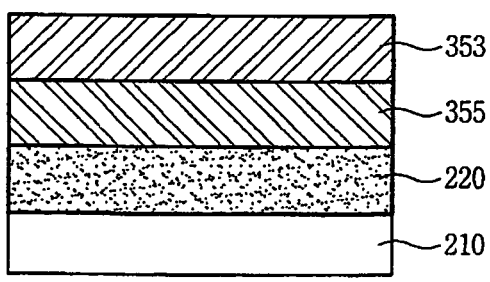

Alternatively, as shown in FIG. 7F, the hole injection layer 355 and hole transport layer 353 may be formed on the first electrode 220, and the electron injection layer 354, electron transport layer 352 and luminescent layer 351 may be formed on the transfer plate 310.

As illustrated by the above examples (FIGS. 7A to 7F), the first substrate 210 on which an organic electroluminescent device is to be formed and a transfer plate 310 used for forming an organic light emitting film of the organic electroluminescent device thereon may be formed using various configurations of the organic layers constituting the organic light emitting film.

A method of fabricating an organic light emitting film will be described with reference to FIG. 5A. A first substrate 210 including a first electrode 220 and a transfer plate 310 including an organic light emitting film 330 are loaded in a vacuum chamber (not shown), a vacuum is formed by a first pumping, and the first substrate 210 and the transfer plate 310 are aligned. While maintaining the vacuum formed in the vacuum chamber, an array of patterns 350 formed on the transfer 310 is aligned over the first electrode 220 of the first substrate.

Figure 5B:
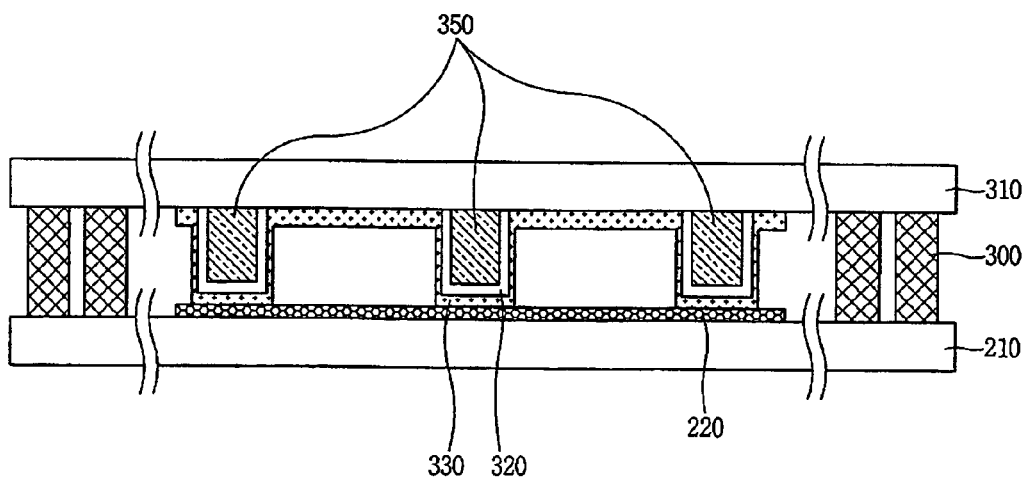

Subsequently, as shown in FIG. 5B, as the vacuum chamber is vented, and with the second substrate of the transfer plate 310 in contact on the first substrate 210, the pressure inside the vacuum chamber increases (that is the vacuum in the vacuum changer decreases) to maintain a pressure difference between the inside (inside of the sealing material on the peripheral of the active area) and outside of a sealing material 300. In other words, the pressure within the active area is maintained at a level lower than the pressure external to the active area. A uniform pressure may be generated using the described pressure difference and applied by the array of patterns 350 on the transfer plate to the first substrate 210 over the entire part of the first substrate 210. The applied pressure causes the organic light emitting film 330 formed on the array of patterns 350 to be transferred onto the first substrate 210.

Figure 5C:
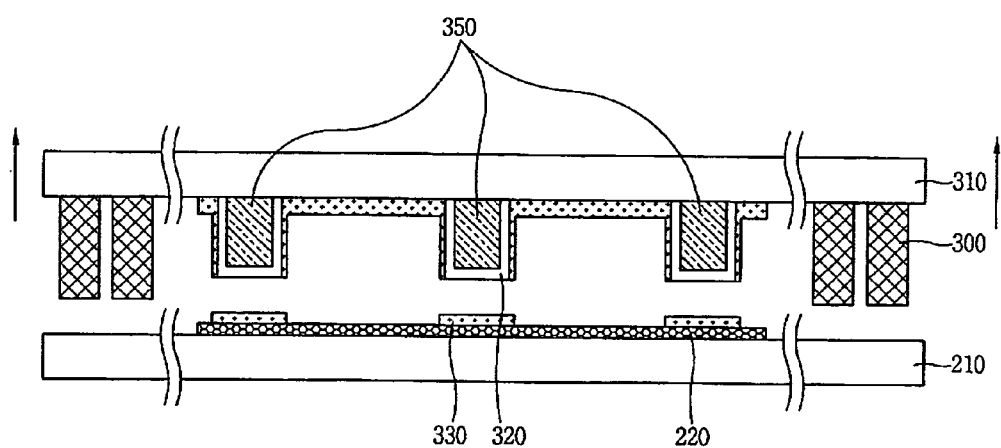

After transferring organic light emitting film 330 onto the first substrate 210, as shown in FIG. 5C, the pressure outside of the sealing material is lowered to a level below that of the inside pressure thereof by increasing the vacuum in the vacuum chamber thus removing the pressure applied between the first substrate 210 and the array of patterns 350. The formation of organic light emitting patterns 360 on the first substrate 210 is completed by separating the second substrate of the transfer plate 310 from the first substrate 210. The separation may be accomplished using a vacuum chuck located on top of the vacuum chamber.

Figure 5D:
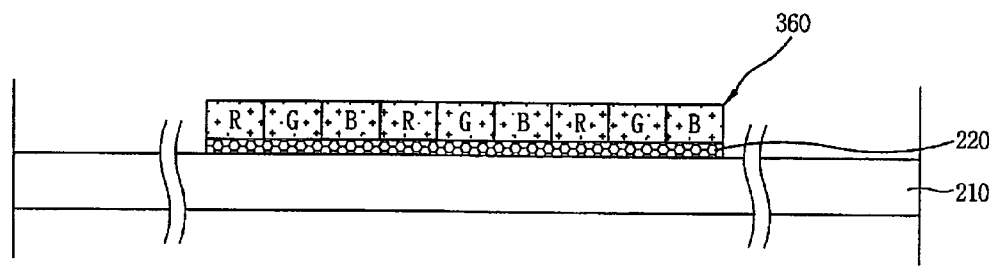

The emission colors of the organic light emitting patterns 360 depend on the particular organic material included in the luminescent layer. As shown in FIG. 5D, by repeating the above-described procedure using luminescent layers of varying organic materials, RGB organic light emitting patterns 360 can be formed.

After transferring all of the organic light emitting patterns 360, a second electrode is formed on top thereof, thereby completing an organic electroluminescent device.

Figure 8:
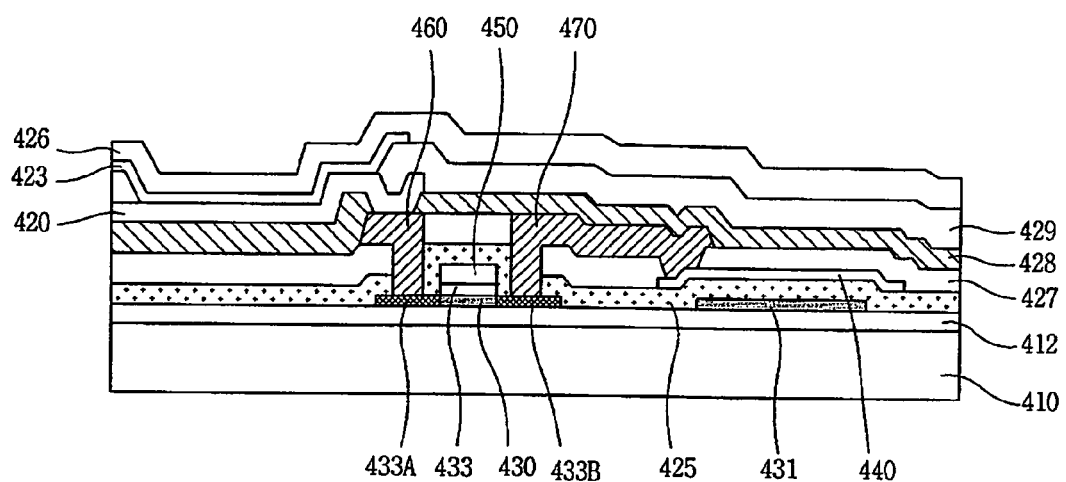
FIG. 8 is a cross sectional view illustrating an organic electroluminescent display device.

FIG. 8 is a cross sectional view showing the structure of the organic electroluminescent display device.

As shown in FIG. 8, the organic electroluminescent device includes a thin film transistor, an organic electroluminescence structure, and a capacitor.

Although a plurality of thin film transistor may be formed in the organic electroluminescent display device, for convenience of explanation a single thin film transistor is shown in FIG. 8. For example, the electroluminescent display device may include a switching thin film transistor and a driving thin film transistor as schematically illustrated in FIG. 2.

The thin film transistor includes a gate electrode 450, an active layer 430, a source electrode 470 and a drain electrode 460. A gate insulating layer 433 is formed between the gate electrode 450 and the active layer 430 to insulate the gate electrode 450 and the active layer 430. A drain region 433A and a drain region 433B having impurities of high density both sides of the active layer 430 and on an insulating layer 412. The source electrode 470 and the drain electrode 460 are connected to the source region 433B and the drain region 433A, respectively.

The organic electroluminescence structure includes a cathode electrode 420 connected to the drain electrode 460, the anode electrode 426 and the organic light emitting layer 423 that includes organic light emitting patterns. As shown in FIG. 3, the organic light emitting layer 423 of the organic electroluminescent display device may include the luminescent layer, the electron injection layer, the hole injection layer, the electron transport layer, and the hole transport layer. Further, the organic light emitting layer 423 can be formed by the methods illustrated in FIG. 4 and FIGS. 7A-7F.

The capacitor includes a lower electrode which may be formed simultaneously with the active layer 430, a power line 440 connected to the source electrode 470, and a first interlayer 425 formed therebetween. On the first interlayer 425, a second interlayer 427, a passivation layer 428 and a third interlayer 429 may be formed.

As described above, the present invention relates to a method of fabricating an organic electroluminescent display device, and more particularly, embodiments of the present invention may provide an organic electroluminescent device having uniform characteristics throughout the entire part of a substrate by preparing a separate substrate to form organic light emitting patterns thereon, applying a uniform pressure throughout the entire part of the substrate using a pressure difference between the inside pressure and outside pressure of an active area within which the organic light emitting patterns are to be formed, and transferring the organic light emitting pattern onto the substrate.

Using methods according to the present invention devices for emitting light upward from the top or the bottom of the device may be manufactured. The present invention may include an organic electroluminescent display device achieved in accordance with the basic concepts of the present invention.

As described above, according embodiments of the present invention, there are provided an organic electroluminescent devices having uniform characteristics throughout the entire part of a substrate by preparing a separate substrate to form organic light emitting patterns thereon, applying a uniform pressure throughout the entire part of the substrate using a difference between the inside pressure and outside pressure of an active area within which the organic light emitting patterns are to be formed, and transferring the organic light emitting patterns onto the substrate, and a method of fabricating an organic electroluminescent display device which can enhance reliability.

Furthermore, an embodiment of the present invention provides a method of fabricating an organic electroluminescent display device which may be advantageous for large-area applications by applying a uniform pressure throughout the entire part of a substrate and transferring organic light emitting patterns.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an organic electroluminescent display device, comprising:

preparing a first substrate;

preparing a transfer plate having at least one transfer pattern;

forming a first electrode on the first substrate;

forming organic light emitting patterns on the at least one transfer pattern on the transfer plate within a region;

loading the first substrate and the transfer plate into a vacuum chamber;

drawing a vacuum inside of the vacuum chamber;

aligning the first substrate and the transfer plate;

forming a sealing material contacting the transfer plate and the first substrate;

bonding the first substrate to the transfer plate in a vacuum state to contact the organic light emitting patterns on the transfer pattern of the transfer plate to the first substrate, the bonded first substrate and the transfer plate being sealed from the inside space of the vacuum chamber;

transferring the organic light emitting patterns on the transfer pattern of the transfer plate onto the first substrate by applying a force caused by the pressure difference between the pressure at the outside of the first substrate and the transfer plate and the pressure at the inside of the first substrate and the transfer plate to the outside surfaces of the contacted first substrate and transfer plate by venting the inside of the vacuum chamber the same pressure being applied to the sealed transfer plate and first substrate when the vacuum chamber is venting;

lowering the pressure inside of the vacuum chamber to differentiate between the inside of the contacted first substrate and transfer plate and the outside of the contacted first substrate and transfer plate; and separating the transfer plate from the first substrate.

2. The method of claim 1, further comprising forming a buffer film between the at least one transfer pattern and the organic light emitting patterns to facilitate the transfer of the organic light emitting patterns onto the first substrate.

3. The method of claim 2, wherein the buffer film is formed of an inorganic film.

4. The method of claim 3, wherein the inorganic film comprises one of silicon oxide (SiOx) and silicon nitride (SiNx).

5. The method of claim 3, further comprising performing a hydrophobic treatment on a surface of the inorganic film.

6. The method of claim 1, wherein the first electrode on the first substrate is an anode.

7. The method of claim 1, wherein forming organic light emitting patterns on the at least one transfer pattern on the transfer plate includes:
   forming an electron injection layer on the transfer plate;
   forming an electron transport layer on the electron injection layer;
   forming a luminescent layer on the electron transport layer;
   forming a hole transport layer on the luminescent layer; and
   forming a first hole injection layer on the hole transport layer.

8. The method of claim 7, further comprising forming an adhesive layer on the first electrode to enhance adhesion to the first hole injection layer.

9. The method of claim 7, further comprising forming a second hole injection layer to be contacted by the first hole injection layer on the first electrode.

10. The method of claim 1, wherein forming organic light emitting patterns on the at least one transfer pattern on the transfer plate includes:
    forming an electron injection layer on the transfer plate;
    forming an electron transport layer on the electron injection layer;
    forming a luminescent layer on the electron transport layer; and
    forming a first hole transport layer on the luminescent layer.

11. The method of claim 10, wherein a hole injection layer is formed on the first electrode.

12. The method of claim 11, further comprising:
    forming a hole injection layer on the first electrode of the first substrate; and
    forming a second hole transport layer on the hole injection layer.

13. The method of claim 1, wherein forming organic light emitting patterns on the at least one transfer pattern on the transfer plate includes:
    forming an electron injection layer on the transfer plate;
    forming an electron transport layer on the electron injection layer; and
    forming a luminescent layer on the electron transport layer.

14. The method of claim 13, further comprising:
    forming a hole injection layer on the first electrode; and
    forming a hole transport layer on the hole injection layer.

15. The method of claim 1, wherein the first electrode on the first substrate is a cathode.

16. The method of claim 1, wherein forming organic light emitting patterns on the at least one transfer pattern on the transfer plate includes:
    forming an hole injection layer on the transfer plate;
    forming a hole transport layer on the hole injection layer;
    forming a luminescent layer on the hole transport layer;
    forming an electron transport layer on the luminescent layer; and
    forming a first electron injection layer on the electron transport layer.

17. The method of claim 16, further comprising forming an adhesive layer on the first electrode to enhance adhesion to the first electron injection layer.

18. The method of claim 16, further comprising forming a second electron injection layer on the first electrode.

19. The method of claim 1, wherein forming organic light emitting patterns on the at least one transfer pattern on the transfer plate includes:
    forming an hole injection layer on the transfer plate;
    forming a hole transport layer on the hole injection layer;
    forming a luminescent layer on the hole transport layer; and
    forming a first electron transport layer on the luminescent layer.

20. The method of claim 19, wherein an electron injection layer is formed on the first electrode.

21. The method of claim 20, further comprising:
    forming an electron injection layer on the first electrode of the first substrate; and
    forming a second electron transport layer on the electron injection layer.

22. The method of claim 1, wherein forming organic light emitting patterns on the at least one transfer pattern on the transfer plate includes:
    forming an hole injection layer on the transfer plate;
    forming a hole transport layer on the hole injection layer; and
    forming a luminescent layer on the hole transport layer.

23. The method of claim 22, further comprising:
    forming an electron injection layer on the first electrode; and
    forming an electron transport layer on the electron injection layer.

24. The method of claim 1, wherein the first electrode is formed of a transparent material.

25. The method of claim 24, further comprising pre-treating the surface of the first electrode in order to enhance adhesion to the organic light emitting patterns.

26. The method of claim 24, wherein the transparent material of the first electrode is one of ITO (indium tin oxide) and IZON (indium zinc oxide).

27. The method of claim 25, wherein pre-treating includes irradiating UV onto the first electrode.

28. The method of claim 25, wherein pre-treating includes treating the first electrode with ozone.

29. The method of claim 25, wherein pre-treating includes treating the first electrode with plasma.

30. The method of claim 1, wherein preparing a transfer plate further comprises forming a sealing material along the periphery of an active area within which organic light emitting patterns are to be formed.

31. The method of claim 1, wherein separating the transfer plate from the first substrate is performed by using a vacuum chuck on top of the vacuum chamber.

* * * * *